United States Patent
Pividori

(10) Patent No.: US 7,192,820 B2
(45) Date of Patent: Mar. 20, 2007

(54) METHOD FOR REDUCING NON-UNIFORMITY OR TOPOGRAPHY VARIATION BETWEEN AN ARRAY AND CIRCUITRY IN A PROCESS FOR MANUFACTURING SEMICONDUCTOR INTEGRATED NON-VOLATILE MEMORY DEVICES

(75) Inventor: Luca Pividori, Curno (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 48 days.

(21) Appl. No.: 11/059,294

(22) Filed: Feb. 16, 2005

(65) Prior Publication Data

US 2005/0185446 A1    Aug. 25, 2005

(30) Foreign Application Priority Data

Feb. 24, 2004    (EP)    ................................... 04425112

(51) Int. Cl.
*H01L 21/336*    (2006.01)
*H01L 21/8234*    (2006.01)

(52) U.S. Cl. ........................................ 438/197; 257/314
(58) Field of Classification Search ................ 438/197, 438/316, 392, 510; 257/314, 315, 316, 317
See application file for complete search history.

(56) References Cited

U.S. PATENT DOCUMENTS 5,899,713 A    5/1999    Acocella et al.
6,455,889 B2 *    9/2002    Sakui .......................... 257/316
6,706,593 B1 *    3/2004    Kodama ...................... 438/258

FOREIGN PATENT DOCUMENTS

| EP | 0 996 152 A1 | 4/2000 |
|---|---|---|
| EP | 1 363 324 A1 | 11/2003 |
| JP | 7183411 | 7/1995 |
| WO | WO 98/44552 | 10/1998 |

OTHER PUBLICATIONS

European Search Report EP 04 42 5112; Jul. 23, 2004.

* cited by examiner

*Primary Examiner*—Phuc T. Dang
(74) *Attorney, Agent, or Firm*—Hogan & Hartson LLP

(57) ABSTRACT

A method for reducing non-uniformity or topography variation between a cell array area and a peripheral circuitry area is used in a process for manufacturing semiconductor integrated non-volatile memory devices, wherein an intermediate stack of multiple layers is provided during the manufacturing steps of gates structures in both the array and circuitry areas. A thin stack comprising at least a thin dielectric layer and a third conductive layer is provided over a second conductive layer before the step of defining the control gate structures in the array and the single gates in the peripheral circuitry. This intermediate stack of multiple layers is used in order to compensate for thickness differences between the dual gate structures in the array and the single gate transistors in the peripheral circuitry.

11 Claims, 4 Drawing Sheets

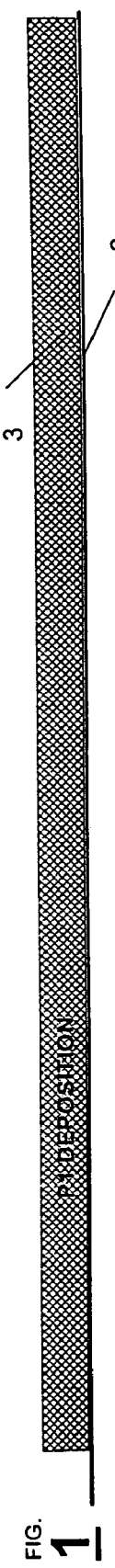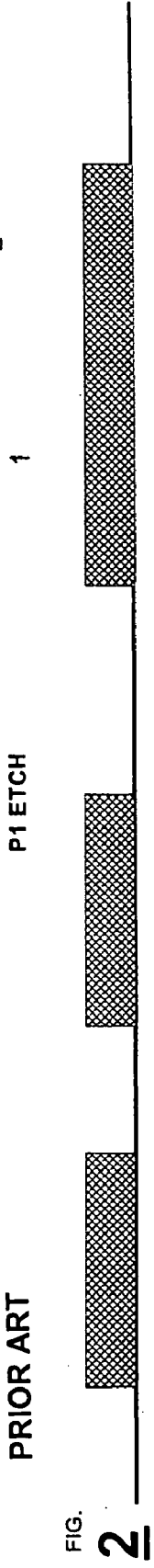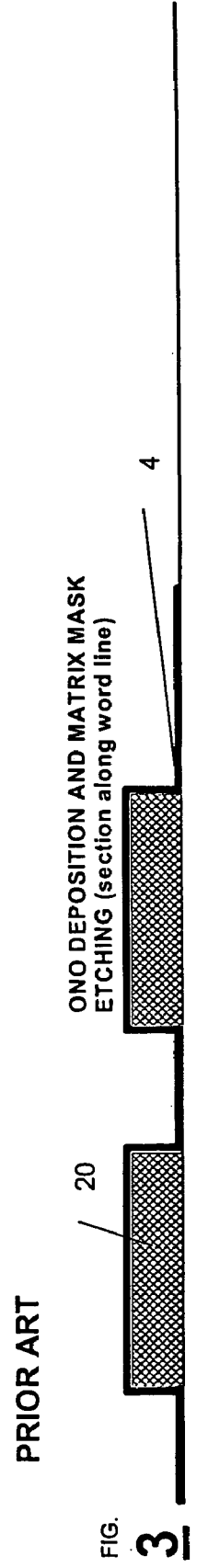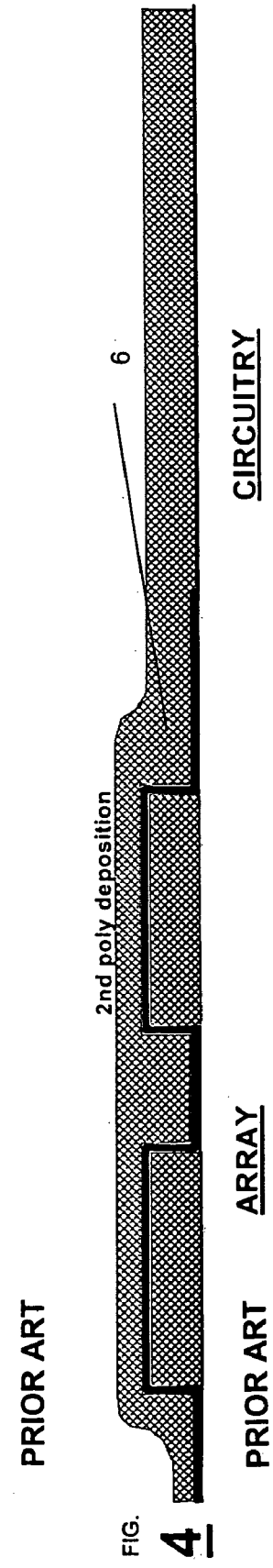

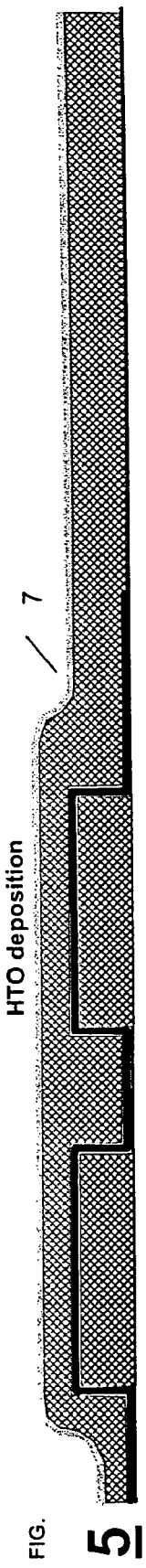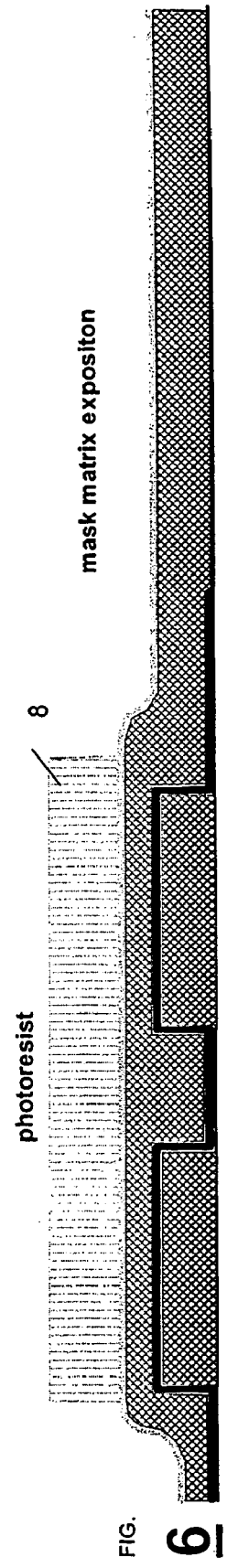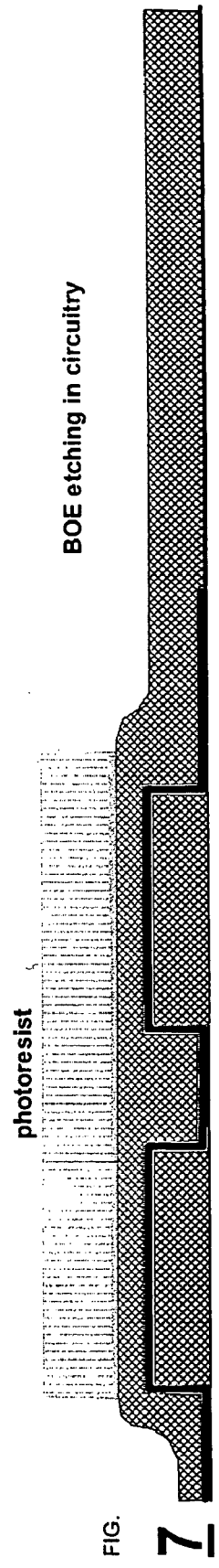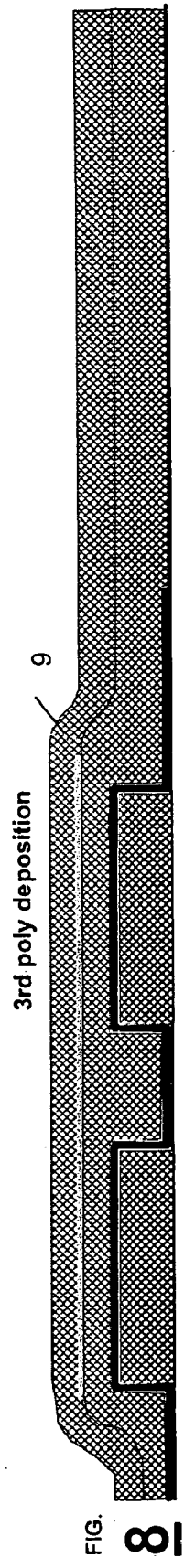

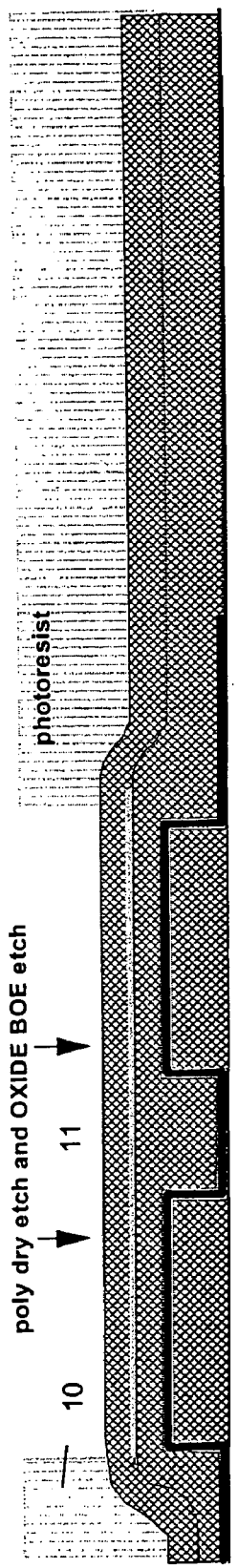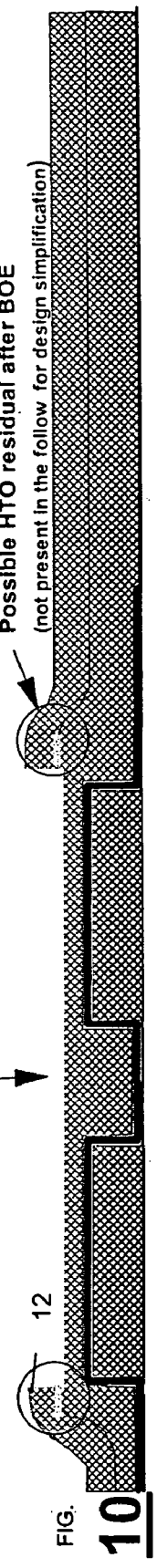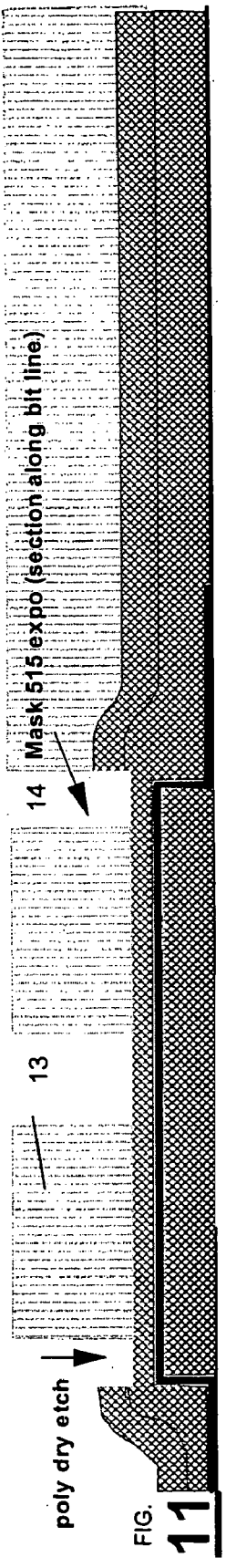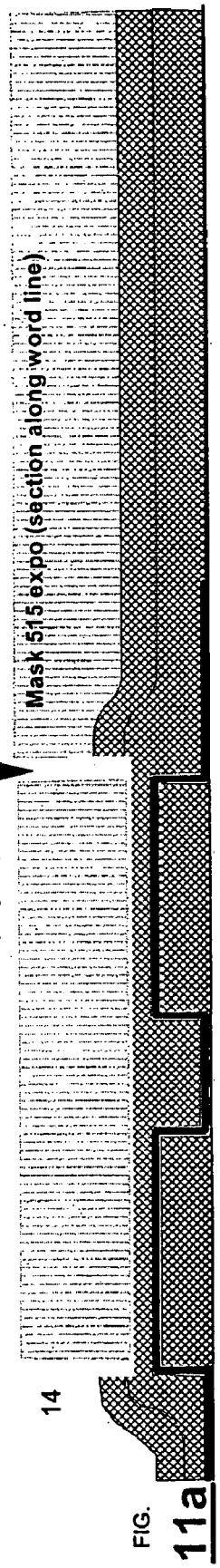

section along bit line after poly etch and resist removal
15 section along word line after poly etch and resist removal
16 poly dry etch
17
18
Mask 505 expo

19

ARRAY  CIRCUITRY

METHOD FOR REDUCING NON-UNIFORMITY OR TOPOGRAPHY VARIATION BETWEEN AN ARRAY AND CIRCUITRY IN A PROCESS FOR MANUFACTURING SEMICONDUCTOR INTEGRATED NON-VOLATILE MEMORY DEVICES

BACKGROUND OF THE INVENTION

1. Field of the Invention

The present invention generally relates to a method for reducing non-uniformity or topography variation in a process for manufacturing semiconductor integrated non-volatile memory devices.

More specifically the invention relates to a method for reducing thickness non-uniformity between a cell array area and a peripheral circuit area during the manufacturing of the circuitry's gate structures after the floating gate structures, or part of them, of the cell array have been realized on the active regions of the semiconductor substrate.

It is well known in the art that, in memory devices realized with technologies requiring dimensions at 0.15 µm or less, thickness non-uniformities between the array and circuitry areas are of increasing importance, in particular in the case of high density memory devices and in the case of so-called multilevel memory devices.

Thickness non-uniformities between array and circuitry areas affect the subsequent process capabilities of lithography and etch to control and define the devices dimensions, especially in the array area. This in turn affects the performances of the whole memory device in the electric detection of the bit stored in the cell's array.

Without any limitation of the scope of the invention and with the only aim of simplifying its disclosure, the following description is given with reference to the process steps for manufacturing the gate structures in the array and circuitry areas of a flash memory device, for example a flash EEPROM memory device. In these memory devices the semiconductor memory cells of the array area use a floating gate to store charges thereon.

In fact the method of the invention can be applied in those cases where thickness non-uniformity between the array and circuitry areas may occur. In particular, it can be applied in those cases where other solutions to improve the processes to define the dimensions of each and every point in the array area, for instance lithographic and etching processes fail or become unfeasible, not suitable, or unreliable, or require the application or development of new materials and new technologies.

2. Description of the Related Art

As is well known to those skilled in the art, most non-volatile memory cells, particularly EPROM, flash EPROM or EEPROM, are formed in a semiconductor substrate using stacked-gate MOS transistors. The memory cells have a floating gate electrode to store charges and a control gate electrode to select the cell in the same way the single gate does in conventional MOS transistors. The term "floating" refers to the fact that no electrical connection exists to this gate.

Typically, the control gate electrode is stacked on the floating gate electrode and two different layers of conductive materials are used to form the double gate structure of the memory cell. A dielectric layer is provided to isolate the two gate layers.

Typically, the conductive material for the double gate structure is polysilicon, while for the dielectric layer, conventionally also called interpoly dielectric, composite films of $SiO_2/Si_3N_4/SiO_2$, Oxide/Nitride/Oxide, often referred to as ONO layers, are generally used, mainly for increased capacitive coupling between the two gate electrodes.

The memory cells are usually organized in a two-dimensional matrix, forming the cell array area. Rows and columns in fact form rectangular arrays. At the intersections of rows and columns, memory cells are realized, so that each cell is capable of storing a binary bit of data.

The columns typically represent the bit lines, while the rows define the word lines and addresses are assigned to each row or column. The process steps to manufacture such memory cells are well known from the prior art and the literature, and reference is made to the book by: S. Wolf and R. N. Tauber, "Silicon Processing for the VLSI Era", Lattice Press, Vol. 2, pg. 632–635.

Besides the cell array area, non-volatile memory devices comprise several other circuit blocks that generally surround the cell array area and form the peripheral circuit area. In the peripheral circuit area, the circuitry typically comprises MOSFET structures to perform operations like programming, reading, erasing and so on. As known and described for instance in the U.S. Pat. No. 6,353,243, MOSFETs are for example the building blocks of row decoder circuits that are responsible for selecting specific rows of memory cells within the cell array. MOSFETs are single gate transistors and their gate electrodes are typically made of polysilicon.

All process steps needed to build and define the cell array area and the circuitry area in non-volatile memory devices are well known to those skilled in the art.

The state of the art process to manufacture an array and circuitry of, for example, a flash EEPROM can be summarized as follow, also with reference to the enclosed FIGS. 1–4.

On a common silicon substrate (1) the active areas for both the memory cell array and the circuitry are first realized.

In its simplest form, the subsequent process of manufacturing the double gate structure of the memory cells and the single gate structure of the associated circuitry can be described in a sequence of steps as follow:

1. Forming a tunnel oxide film (2) on the active regions;
2. Depositing a polysilicon layer (3), indicated as Poly1 or P1 in FIG. 1: this layer is used for the floating gate electrode. The polysilicon layer 3 is to be kept only in the array while it is to be removed from the circuitry, as illustrated in FIG. 2.
3. Depositing a dielectric layer, the interpoly dielectric (4), which is generally a composite film of Oxide/Nitride/Oxide, the so-called "ONO" layers;
4. Patterning and etching (typically dry etching) the interpoly dielectric layer 4 and the polysilicon layer 3, to define the floating gate electrode of the memory cells, according to the mask pattern that defines the two-dimensional matrix of the cell array area (MATRIX mask, as illustrated in FIGS. 3 and 3a);
5. Forming one or more gate oxide layers;
6. Depositing a second polysilicon layer (5), according to FIG. 4. This layer is used for forming both the control gate electrodes in the array and the single gate electrodes in the circuitry;
7. Patterning and defining the dual-polysilicon-gate structure of the memory cells in the matrix, using a so-called self-aligning mask;
8. Patterning and defining the single gates of the MOSFETs in the circuitry, using a so-called circuitry mask.

The manufacturing process continues with the subsequent formation of contacts and metal interconnects.

One of the issues that emerges from the process steps of creating the gate structures in the cell array area and in the circuitry area, as it has been just described, is related to the thickness differences between the total stack deposited to realize the double gate structure of the memory cells and the stack that forms the single gate structure in the circuitry.

In fact what happens is that generally the thickness of the second polysilicon layer, which is used for creating both the control gate of the memory cell in the array area and the single gate of the transistors in the circuitry area, cannot compensate for the thickness of the stack that is already in place for the memory cells.

In the specific case of this simplified example, by summing up the thicknesses of the different layers forming the memory cell, i.e. the stack made of the tunnel oxide, the first polysilicon layer, the interpoly dielectric and the second polysilicon layer in the array reaches a typical height of about 4000–4200 Å. On the other hand, in the circuitry area, the stack formed by the gate oxide and the second polysilicon layer builds up a total height of 2500–2700 Å.

Therefore a thickness in excess of about at least 1500 Å exists for the structures in the array with respect to the structures in the circuitry. This creates a "step" between the two structures.

The existence of such a step between the array area and the circuitry area is the source of severe issues and limitations in the process capabilities and reliabilities in the subsequent manufacturing steps.

Problems arise for example during the spinning of the antireflective coatings (BARC) and the subsequent application of the photoresist.

In fact, the antireflective coating is applied directly to the substrate and the resist is spun on top of it. Patterns are developed according to the specific mask layout, due to lithographic techniques, into the photoresist film and, if that is the case, into the BARC, in order to make possible the subsequent transfer of said patterns and the definition of the structures onto the deposited layers by etching.

As known in the art, see for instance the book by: S. Wolf and R. N. Tauber, "Silicon Processing for the VLSI Era", Lattice Press, Vol. 1, pg. 430–446, BARC and resist coating steps represent critical phases in the integrated circuit manufacturing process. The coating steps produce a uniform, adherent film of desired thickness over the entire wafer and across the different device areas. In order to maintain reproducible dimensions and linewidth in device fabrication applications, photoresist film uniformity across the wafer and all over the different device areas should be within about ±100 Å.

Lack of uniformity in BARC and resist coating leads hence to the co-existence of:

Regions with the correct desired thickness (within process specifications), where the lithographic process is capable of and reliable in defining the required dimensions and linewidths;

Other regions characterized by BARC and/or photoresist fims with thicknesses outside the process specifications, i.e. thicker or thinner than required, so that, during the exposure of the lithographic process, photoresist linewidth variations occur due to a local "out of focus" situation.

An "out of focus" situation, with consequent photoresist linewidth variations, is the main source of irregularities in the definition of the gate dimensions, causing the latter to be outside the process and device specifications.

A typical effect, often observed by those skilled in the art, is a dimensional loss of the gate structures in the cell array (below the standard) that severely impacts the correct functioning of the memory device.

Demanding requirements to shrink the critical dimensions at 0.15 μm or below often find their limit in the capability of the lithographic process sequences to minimize linewidth variation over steps, and the case of thickness non uniformity in non volatile memory devices between array and circuitry is particularly evident.

A variety of procedures have been investigated to improve the lithographic process, in order to prevent or minimize the effects of those steps, like the introduction of thick resist layers, post exposure bakes, the use of special antireflective coatings and so on: reference is still made to the book by S. Wolf and R. N. Tauber, "Silicon Processing for the VLSI Era", Lattice Press, Vol. 1, pg. 440–442.

As well known to those skilled in the art, special photoresists and antireflective coatings are today available to offer a deposition process characterized by the particular property of conformity of the deposited film.

Although those special materials represent an improvement of the actual situation, on the other hand they also require the introduction of new lithographic technologies and/or new type of etching processes that increase the process complexity.

Unfortunately most of those special photoresists and antireflective coatings, together with the technologies and the processes for their use, are still in the research or in the development phase, and are therefore not suitable for industrial production.

Except for the on-going development and introduction of those new materials, however, it appears that no solutions have yet been provided to the technical problem of the limitations in the lithographic process capabilities to minimize dimensions and linewidth variations over steps, particularly when the steps are in relationship with the thickness non-uniformity between a cell array area and a peripheral circuit area of non-volatile memory devices.

Moreover, no solutions have been provided that are:
  free of specific requirements or limitations for the material to use;
  compatible with the conventional lithographic and etch processes;
  compatible with the current manufacturing process flow limiting the increase in process complexity; and
  have negligible influence on subsequent manufacturing steps.

Thus, in the semiconductor manufacturing field there exists a strong need for providing a method of manufacturing a semiconductor integrated non-volatile memory device wherein the non-uniformity between array and circuitry areas is reduced, where said non-uniformity may cause lack of dimensional control and linewidth variation in the lithographic and etch patterning processes of the gate stacks, i.e. the formation of the control gate in the array and the single gate in the circuitry.

In particular, the aim of the present invention is providing a method to minimize the step or to reduce the difference in thicknesses that are evident from the prior art at the moment the substrate reaches the lithographic and etch patterning process steps that define simultaneously the control gate structure in the array and the standard gate structure in the circuitry.

Another goal of the present invention is to prevent linewidth and critical dimension variations across the wafer and across the device, in particular between cell array area and a peripheral circuit area, before the wafers reach the process steps that define and create the structure of the control gates in the cell array and of the single gate in the peripheral circuitry.

SUMMARY OF THE INVENTION

According to an embodiment of the present invention a method is provided that obviates the incompatibilities and limitations of the prior art by introducing an intermediate stack of multiple layers that compensates for the thickness differences, which generally result during the manufacturing of the dual gate structures in the array and the single gate transistors in the circuitry.

Said intermediate stack may advantageously comprise:
a thin dielectric layer, e.g. an oxide layer, and
a conductive layer, e.g. a polysilicon layer, but it may be virtually comprise any other suitable material.

According to an embodiment of the present invention the technical problem is solved by a method as previously indicated and including at least the following steps:
defining the active areas of the memory cells array and of the circuitry on a semiconductor substrate;
depositing a thin oxide layer over said active areas;
defining the floating gate structures of the memory cells in the array area using a first conductive layer on which dielectric films have been deposited;
providing one or more oxide layers, specifically active gate oxide layers, over the active areas of the circuitry;
depositing a second conductive layer over said dielectric films and said oxide layers; and providing a thin stack comprising at least a thin dielectric layer and a third conductive layer over said second conductive layer before the step of defining the control gate structures in the array and the single gates in the circuitry.

The features and advantages of the method according to this invention will become apparent from the following description of an embodiment thereof, given by way of non-limiting examples with reference to the accompanying drawings.

BRIEF DESCRIPTION OF THE DRAWINGS

FIGS. 1 to 3a illustrate schematically the process to form, in the array of memory cells, a conventional film stack of tunnel oxide, polysilicon and interpoly dielectric that structures the floating gates;

FIG. 4 depicts schematically a conventional structure for defining the floating gate structure in the array of the memory cells on which the second polysilicon layer has been applied;

FIGS. 5 and 6 illustrate the structure of FIG. 4, after a dielectric deposition, which is advantageously a High Thermal Oxide (HTO) layer, and Photo-resist patterning, according to an embodiment of the invention;

FIG. 7 shows the structure of FIG. 6 after dielectric etching of the HTO with its removal from the circuitry area;

FIG. 8 illustrates schematically the semiconductor structure obtained from the one of FIG. 7, after the removal of the Photoresist mask and the deposition of the third conductive layer, advantageously made of polysilicon;

FIG. 9 depicts the same inventive multilayer structure of FIG. 8, after Photo-resist patterning;

FIG. 10 illustrates the inventive structure of FIG. 9 after polysilicon etching and oxide removal in the cells array area, according to an embodiment of the invention, and wherein the photoresist mask has been removed;

FIGS. 11 and 11a depict schematically the photoresist patterning of the structure obtained as shown in FIG. 10 to define the memory cell structures in the array area;

DETAILED DESCRIPTION

Figure 12:
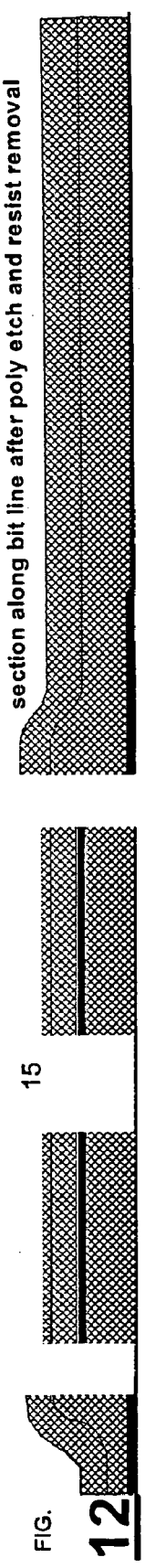
FIGS. 12 and 12a show the multilayer structure of FIG. 11, after polysilicon etching and photo-resist mask removal, wherein the dual gate structures of the cells in the array have been defined.
Figure 12A:
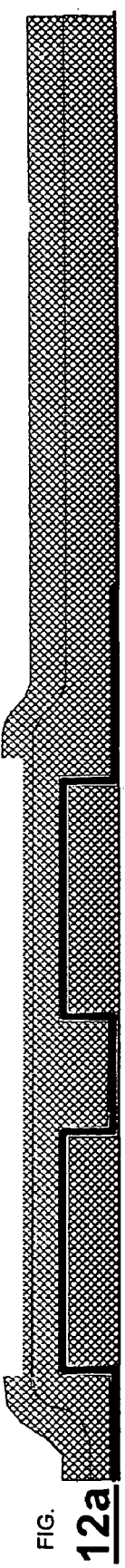

Referring to the drawing views, in particular the structures of FIGS. 1–3, generally and schematically shown at 1 is a substrate of a semiconductor material, e.g. silicon in which the active areas of the memory cells array and the active areas of the circuitry have been defined. This basic structure is subjected to sequential processing steps according to the method of this invention.

The process steps and the structures described herein below do not form a complete process flow for manufacturing integrated circuits. In fact, this invention can be practiced jointly with integrated circuit manufacturing techniques currently used in the art, and only those common process steps are discussed herein as are necessary to an understanding of the invention.

The drawing figures show cross-sections through a semiconductor wafer but are not drawn to scale but highlight major features of the invention.

The example described below refers specifically to the manufacturing of a flash memory device in order to clarify the description and facilitate the understanding, but this shall not be intended as a limitation or restriction of the scope of the invention.

FIG. 1 depicts the as-deposited stack of a typical floating gate structure in a memory cell array. The simplified structure comprises a base semiconductor substrate 1, for instance a silicon layer in which the active areas of the memory cells array and the peripheral circuitry have been defined, on top of which are disposed in sequence:
a thin dielectric, for example a tunnel oxide 2.
a first conductive layer 3, for example polysilicon, applied on the tunnel oxide 2.

Referring to FIG. 2, with an appropriate masking process, the first layer of polysilicon is removed from the circuitry and the polysilicon structures are left in the array region.

Features 20 and 21 in FIGS. 3 and 3a represent respectively the section view from the bit-line and from the word-line of the floating gate structures that are part of the dual gate structure of the memory cells in the array. Said features have a thin tunnel oxide interposed between the substrate 1 and the first polysilicon 3.

One or more dielectric layers are deposited on top of features 20 and 21 to form the so-called interpoly dielectric. Without any limitation, in this example the interpoly dielectric is a sandwich structure of Oxide/Nitride/Oxide layers, often simply called the "ONO" layer.

After one or more oxide layers 5, specifically active gate oxide layers, have been arranged on the substrate to start creating the stack of the single gate structures of the transistors in the circuitry, as shown in FIG. 4, a second conductive layer 6, advantageously also a polysilicon layer, is deposited all over the different areas of the device.

FIGS. 4–11 schematically illustrate, according to an embodiment of the present invention introducing an intermediate stack of multiple layers in order to compensate for the thickness differences, between the dual gate structures in the array and the single gate transistors in the circuitry. According to the present invention in fact, polysilicon layer 6 of FIG. 4, is thinner than second conductive layer of the prior art, and it has instead a suitable thickness of about 1000 Å.

Within the sequence of steps needed to realize the inventive solution idea of an intermediate stack, the deposition of a dielectric thin layer 7 in FIG. 5, that in this example advantageously is an High Thermal Oxide further referred to as HTO, follows the deposition of the second polysilicon layer. In this example the thickness of the HTO is kept at about 100–150 Å.

Referring to FIG. 6, a photoresist layer 8 is formed on top of the HTO layer 7.

As known in the art, exposure radiation is selectively applied to a mask (EPM) or reticle to selectively expose and isolate various regions of the photoresist layer 8 to develop a photoresist pattern that protect the HTO in the array area while leaving exposed the portion of HTO located over the circuitry area.

As shown in FIG. 7, this photoresist pattern is then subsequently transferred into the HTO layer 7 via an etching process step, which in this example is a wet etch process (BOE) in HF. The circuitry area is completely freed from the HTO layer, which remains instead over the array area.

The choice of using an HTO layer and to remove it with a BOE/HF wet etch process is on grounds of expediency. This choice for implementing the solution idea is therefore not binding, and the use of other dielectric films, for example silicon nitride among others, together with the use of other etching processes and/or techniques suitable for the removal of the dielectric of choice, does not affect the final result, providing the dielectric is in this step fully removed from the circuitry.

After photoresist removal, FIG. 8 illustrates a further step according to an embodiment of the present invention. A third conductive layer 9, advantageously a polysilicon layer in this example, is deposited on top of the resulting structure, after BOE/HF etching and photoresist removal, i.e. the polysilicon contacts the HTO in the array area while it is directly on top of the second polysilicon layer in the circuitry area.

The thickness of this third layer should be selected so that, in the circuitry area, the total height resulting from the sum of the second polysilicon layer 6 and the third polysilicon layer 9 equals the thickness required for the gate structures of the transistors in the circuitry. In this example the third polysilicon layer has a thickness of about 1500 Å.

As depicted in FIG. 9, a new photoresist layer 10 is disposed on top of the third polysilicon layer 9 and is patterned according to a mask layout (MATRIX) that leaves exposed the sole array area. A subsequent sequence of etching steps including, but not limited to,

- a polysilicon dry etch step to remove from the array area the portion of the exposed third polysilicon layer 9; and
- a wet etch step, a BOE etch step in this example, to remove the portion of the HTO film that, originally placed below the third polysilicon layer, remains exposed in those same regions where the polysilicon film has been removed as a consequence of the step above.

After the remaining photoresist has also been removed the resulting structure is illustrated in FIG. 10.

As can be noted, when implementing the method of the invention, the resulting profile of the array area and of the circuitry area shows improved thickness uniformity between the array and the circuitry structures.

Figure 13:
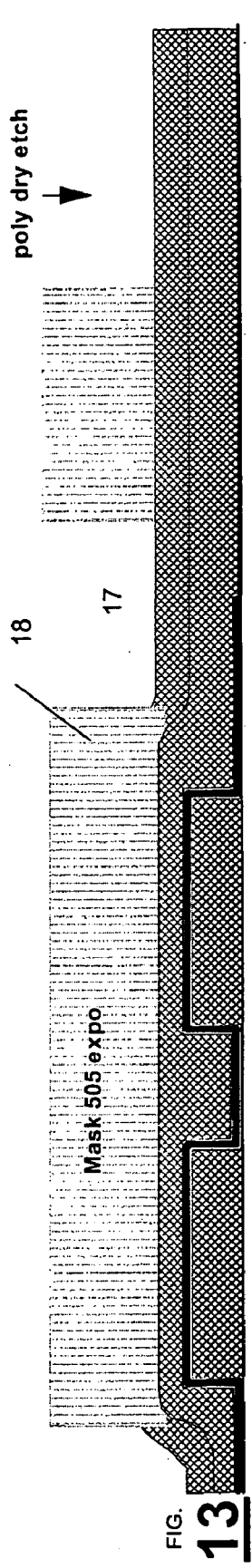
FIG. 13 depicts schematically the photo-resist patterning of the inventive structure obtained as shown in FIG. 10 to define the single gate transistor structures in the circuitry area.
Figure 14:
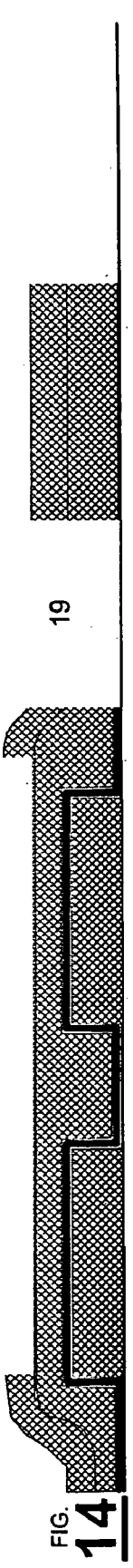
FIG. 14 illustrates a single gate structure as obtained from the patterning shown in FIG. 13, after polysilicon etching and photo-resist mask removal, wherein both the dual gate structures of the cells in the array and the single gates of the transistors in the circuitry have been defined.

FIGS. 11–14 illustrate how, from the structures characterized by an improved thickness uniformity across the device, the process could proceed according to the standard process flow, i.e. with masking, patterning and etching to define the memory cells in the array and the transistors in the circuitry.

Advantageously, the top surface, presented in FIG. 10 as the result of implementing the solution idea of the invention, is spun with a photoresist layer, and eventually also with a Bottom Antireflective Coating (BARC), being flat enough to allow the correct operation of the subsequent lithographic and etching process steps, i.e. said surface is characterized by steps of reduced height so that the thickness non-uniformities, if any, are negligible for the subsequent lithographic and etching process steps.

Thus, the invention provides a method for reducing thickness non-uniformities between the cell array and the circuitry, and in turn it provides the boundary conditions that allow and guarantee the correct functioning and performance of the subsequent processes of: a) lithographic exposure and developing of the photoresist layer; b) etching and transfer of the pattern into the underlying layers.

The introduction of:
- the intermediate stack, made of the second polysilicon layer, the HTO dielectric film and the third polysilicon layer; and
- the additional process steps required to depositing, patterning and adequately removing portions of the intermediate stack, does not increase process complexity and does not interfere with the standard process flow and the techniques generally in use in the art and known to those skilled in the art.

With the solution idea of the present invention there is no longer need for special materials as photoresist and/or BARC films, capable of a more conformal deposition over the original structures that in the prior art processes are necessarily characterized by thickness non uniformities across the device, between cell array and peripheral circuitry.

The need of special dedicated technologies to deal with the said special materials could in fact introduce further complications as described before.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. A method for reducing non-uniformity or topography variation between a cell array area and a peripheral circuitry area in a process for manufacturing semiconductor integrated non-volatile memory devices comprises:
    providing an intermediate stack of multiple layers during manufacturing of gates structures in both the array and circuitry areas;
    defining the active areas of the memory cells array and of the circuitry on a semiconductor substrate;
    depositing a thin oxide layer over said active areas;
    defining the floating gate structures of the memory cells in the array area using a first conductive layer on which dielectric films have been deposited;
    providing one or more oxide layers, specifically active gate oxide layers, over the active areas of the circuitry;
    depositing a second conductive layer over said dielectric films and said oxide layers; and
    providing a thin stack comprising at least a thin dielectric layer and a third conductive layer over said second conductive layer before the step of defining the control gate structures in the array and the single gates in the circuitry, wherein the thickness of the third conductive layer is predetermined so that the sum of the thicknesses of the second polysilicon layer and the third polysilicon layer equals the thickness required for the gate structures of the transistors in the circuitry.

2. The method of claim 1, wherein said third conductive layer and the underlying thin dielectric layer are removed from the cell array area.

3. The method of claim 1, wherein said thin dielectric layer is completely removed from the circuitry area.

4. The method of claim 1, wherein said first conductive layer comprises polysilicon.

5. The method of claim 1, wherein said second conductive layer comprise polysilicon.

6. The method of claim 1, wherein said dielectric layer or stack comprise a sequence of Oxide, Nitride, and Oxide layers.

7. The method of claim 1, wherein said second conductive layer has a thickness of about 1000 Å.

8. The method of claim 1, wherein said third conductive layer has a thickness of about 1500 Å.

9. The method of claim 2, wherein said removal step is performed by a subsequent sequence of etching steps.

10. A method for reducing non-uniformity or topography variation between a cell array area and a peripheral circuitry area in a process for manufacturing semiconductor integrated non-volatile memory devices comprises:
    providing an intermediate stack of multiple layers during manufacturing of gates structures in both the array and circuitry areas;
    defining the active areas of the memory cells array and of the circuitry on a semiconductor substrate;
    depositing a thin oxide layer over said active areas;
    defining the floating gate structures of the memory cells in the array area using a first conductive layer on which dielectric films have been deposited;
    providing one or more oxide layers, specifically active gate oxide layers, over the active areas of the circuitry;
    depositing a second conductive layer over said dielectric films and said oxide layers; and
    providing a thin stack comprising at least a thin dielectric layer and a third conductive layer over the second conductive layer before the step of defining the control gate structures in the array and the single gates in the circuitry; and
    removing the third conductive layer and the underlying thin dielectric layer from the cell array area by a subsequent sequence of etching steps comprising a polysilicon dry etch step to remove from the array area the portion of the exposed third conductive layer.

11. A method for reducing non-uniformity or topography variation between a cell array area and a peripheral circuitry area in a process for manufacturing semiconductor integrated non-volatile memory devices comprises:
    providing an intermediate stack of multiple layers during manufacturing of gates structures in both the array and circuitry areas;
    defining the active areas of the memory cells array and of the circuitry on a semiconductor substrate;
    depositing a thin oxide layer over said active areas;
    defining the floating gate structures of the memory cells in the array area using a first conductive layer on which dielectric films have been deposited;
    providing one or more oxide layers, specifically active gate oxide layers, over the active areas of the circuitry;
    depositing a second conductive layer over said dielectric films and said oxide layers; and
    providing a thin stack comprising at least a thin dielectric layer and a third conductive layer over the second conductive layer before the step of defining the control gate structures in the array and the single gates in the circuitry; and
    removing the third conductive layer and the underlying thin dielectric layer from the cell array area by a subsequent sequence of etching steps comprising a wet etch step to remove the portion of the thin dielectric layer that remains exposed after the third conductive layer removal.

* * * * *